Feb. 9, 1971 G. G. SLATEN 3,561,964

METHOD FOR PRODUCTION OF SOLID STATE STORAGE PANELS

Filed July 19, 1968

INVENTOR.
GARY S. SLATEN

BY Joseph Hirsch

ATTORNEY

United States Patent Office 3,561,964

Patented Feb. 9, 1971

3,561,964

METHOD FOR PRODUCTION OF SOLID STATE STORAGE PANELS

Gary G. Slaten, Palo Alto, Calif., assignor to Xerox Corporation, Rochester, N.Y., a corporation of New York Filed July 19, 1968, Ser. No. 746,178
Int. Cl. G03c 5/00, 5/06, 1/92
U.S. Cl. 96—36.2 10 Claims

ABSTRACT OF THE DISCLOSURE

This application relates to a method for the production of solid state storage panels wherein portions of a transparent, conductive metallic compound layer are converted to the opaque metal to later function as a complementary mask so that only one external mask is necessary during production. The opaque metallic segments inherently provide accurate registration with the juxtaposed segments of transparent, conductive metallic compound segments so the overlying segments of phopshor material are properly positioned.

The invention described herein was made in the course of or under a contract with the Department of Defense.

BACKGROUND OF THE INVENTION

This invention relates to electroluminescent devices and, in particular, to electroluminescent devices of the type adapted to store electrical signals. More particularly, this invention relates to an electroluminescent device of the storage type wherein an optical input image causes the formation of an electrostatic charge pattern on the surface of a field effect semiconductor material, said field effect semiconductor material operating to regulate the flow of current through the storage device and thereby regulate the output image.

At present, a variety of solid state imaging devices are known but have not received significant utilization because of the practical problems encountered in their production and operation. The storage action of these devices depends on one of several different phenomena including the slow decay of conductivity after excitation of a photoconductive material, the hysteresis effect in photoconductors, and optical feedback. Some of the factors operating against the practical use of such solid state imaging devices include low sensitivity to input radiation, low light output, poor or no half-tones, difficulty in providing image erasure, and a relatively low ratio of output light to background light.

For example, one type of solid state imaging device involves a display panel consisting of a layer of variable impedance material in series with a layer of electroluminescent material as described in the patents to Benjamin Kazan U.S. No. 2,768,310 issued Oct. 23, 1956, and U.S. No. 2,949,527 issued Aug. 16, 1960. As described therein, the image is produced by the increase in conductivity of the portions of the variable impedance material, in this instance, a photoconductive material, upon which incident radiation impinges. Such conductivity increase produces a corresponding luminescence in the adjoining portion of the electroluminescent material.

In copending application Serial No. 582,856 filed Sept. 29, 1966, a continuation-in-part application of Serial No. 514,860 filed Dec. 20, 1965, now abandoned, there is disclosed a new and improved electroluminescent storage device which is not subject to defects which plague the operation of prior known storage panels. The storage device involves a display panel comprising a plurality of spaced electrodes on one surface of a supporting substrate, a layer of electroluminescent material overlying the plurality of electrodes and forming a part of the electrical connection between the electrodes, and a layer of a field effect semiconductor material overlying the layer of electroluminescent material and forming a succeeding part of the electrical connection between the electrodes, the panel having a charge-retaining surface adapted to store an electrostatic charge pattern thereon. Such a panel is used in combination with means for forming and/or depositing a charge pattern on the charge-retaining surface. In operation, an alternating current voltage is applied between the spaced electrodes which is sufficient to induce electroluminescence when the field effect semiconductor is at its low impedance state. It was found that the deposition of an electrostatic charge on the charge-retaining surface of the display panel could be used to control the flow of current from electrode to electrode. Deposition of electrostatic charge increases the impedance of the field effect semiconductor thereby reducing or interrupting the flow of current in adjacent areas. Reduction of current flow causes a corresponding reduction in light output from the electroluminescent layer resulting in a half-toned response. If the current is lowered below that which is sufficient to induce electroluminescence, luminescence will not occur and that particular portion of the storage device will appear dark. Conversely, the impedance is lowered and current flow increased as the charges are neutralized or removed from the surface thereby resulting in the restoration of light output in adjacent areas. By selectively placing or modifying a charge pattern on the surface of the display panel an image can be produced and stored for long periods of time.

Additionally, the impedance of the field effect semiconductor layer can be lowered and current flow increased if charges of a proper polarity are placed on the charge-retaining surface. Thus, if current flow is initially insufficient to cause luminescence, current flow can be increased by depositing such charges of proper polarity whereby light output can be obtained from adjacent portions of the storage device. Current flow between electrodes can be decreased by neutralizing or eliminating the surface charge and, as with the above, if flow is decreased below a certain threshold value, light output will be terminated. By operating in this manner, images can be produced and stored for long periods of time.

In copending application Serial Number 722,285 filed Apr. 18, 1968, there is disclosed an improvement upon the storage panels described in the aforementioned copending applications wherein each spaced electrode has substituted therefor a narrow opaque conductor having an overlying conductive strip. Additionally, in a presently preferred embodiment disclosed therein, segments of electroluminescent material overlie each conductive strip and are separated from succeeding segments by intervening segments of insulating material.

To produce storage panels wherein a segment of one material is accurately positioned over an underlying strip of the same width requires accurate and precise registration techniques. Conventionally, such procedures would require two accurate complementary masks precisely registered at different times during the method of production. Though such procedures can be utilized to produce satisfactory results, the aforementioned registration problems make satisfactory results difficult to obtain and, accordingly, it would be desirable to produce storage panels of the type described wherein only a single photographic mask is utilized.

OBJECTS OF THE INVENTION

It is, therefore, an object of this invention to provide a novel method for the production of electroluminescent storage panels.

It is an object of this invention to provide a method for the production of electroluminescent storage panels of the type described which requires only one external photographic mask.

A further object of this invention is to provide a method for the production of solid state storage devices having overlying layers of predetermined width wherein the layers are inherently in perfect registration.

Yet a still further object of this invention is to provide a novel method for producing solid state storage devices of the type described wherein material segments overlying other material segments of equal width are inherently in perfect registration.

Yet a still further object of this invention is to provide a novel method for the production of solid state storage devices which is devoid of difficult registration problems.

It is a further object of the present invention to describe a novel method for the production of solid state storage panels wherein portions of a transparent, conductive metallic oxide layer are converted to opaque metallic segments, the segments later on in said method functioning as a complementary mask which is inherently in perfect registration with juxtaposed unconverted metallic oxide portions.

The above and still further objects, features and advantages of the present invention will become apparent upon consideration of the following detailed disclosure of specific exemplary embodiments.

SUMMARY OF THE INVENTION

In its broadest aspects, the above and still further objects may be accomplished in accordance with the present invention by providing a transparent supporting substrate having a thin transparent tin oxide layer thereon; coating the tin oxide surface with a thin layer of a photoresist material or composition; exposing the photoresist through a photographic mask to insolubilize exposed portions thereof; removing the unexposed portions of the photoresist; reducing the unprotected transparent tin oxide to opaque metallic tin; coating the exposed tin and photoresist surfaces with a photoresist-electroluminescent phosphor material; exposing the photoresist-electroluminescent phosphor material through the transparent supporting substrate and the transparent tin oxide to insolubilize exposed portions thereof, exposure of portions of the overlying photoresist-electroluminescent phosphor layer being prevented by the underlying segments of opaque metallic tin functioning as a complementary mask which, inherently, is in perfect registration with juxtaposed segments of transparent tin oxide; removing the unexposed portions of the photoresist-electroluminescent phosphor material (i.e., above the opaque metallic tin segments); removing the metallic tin segments; depositing an electrically insulating material between the vertical stacks of transparent tin oxide, photoresist, and photoresist-electroluminescent phosphor material; and, thereafter, depositing a field effect semiconductor control layer uniformly over the working surface of the panel. Optionally, the insulating material deposited between the aforesaid vertical stacks can also be applied to the top exposed surface of the photoresist-electroluminescent phosphor segment to reduce the fragility of the phosphor lines and to seal the phosphor composition from ambient moisture.

In one embodiment of the invention, the tin oxide conductive strips are the only electrodes supported by the underlying substrate. In a further and presently preferred embodiment, a plurality of thin, opaque conductors are disposed on one surface of the supporting substrate and, thereafter, a layer of transparent tin oxide deposited thereon. The method of production of panels proceeds as given above in the preceding paragraph to produce a solid state storage panel similar to that disclosed in copending application Serial Number 722,285. The opaque conductors can either be placed on the supporting substrate or be positioned in substantially parallel trenches provided therein. Because of the thinness of the opaque conductors they do not retard the insolubilization of the photoresist-electroluminescent phosphor material during exposure thereof through the transparent supporting substrate and transparent tin oxide segments.

BRIEF DESCRIPTION OF THE DRAWINGS

The nature of the invention will be more easily understood when it is considered in conjunction with the accompanying drawings wherein:

Referring to FIG. 1, there is shown a transparent supporting substrate 10 having a transparent, conductive tin oxide coating 12 deposited thereon. Suitable substrates include those transparent materials which are inert to those materials which it will contact later in the fabrication process, especially in the metallic tin production step. Typical substrates include plate glass, Pyrex, etc. Overlying coating 12 is a layer 14 of photoresist material. Layer 14 is exposed to light source 16 through photographic mask 18 to insolubilize exposed portions 20 of layer 14. This can best be seen in FIG. 2 wherein exposed portions 20 of layer 14 remain after the unexposed portions have been removed.

Figure 1:
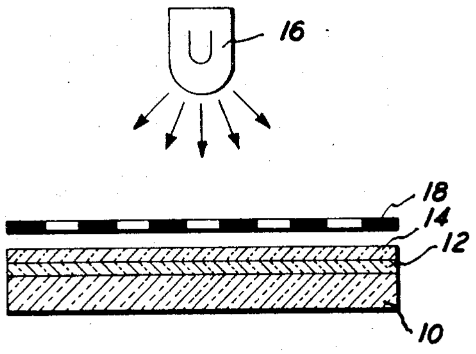
FIGS. 1 through 6 are enlarged cross-sectional views illustrating diagrammatically the steps followed in fabricating the solid state storage panels in accordance with the process of the present invention.
Figure 2:
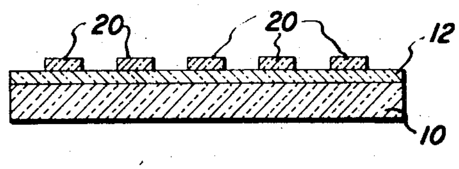
Figure 3:
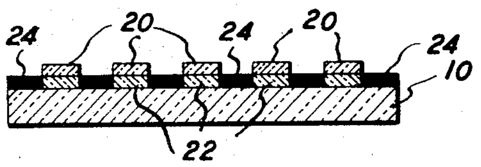

The next step in the fabrication process is to reduce the unprotected tin oxide to metallic tin. This can be seen in FIG. 3 wherein segments 20 of the insolubilized photoresist material protect underlying segments 22 of transparent tin oxide. Portions of the tin oxide layer unprotected by overlying photoresist segments are reduced to segments 24 of metallic tin which are in juxtaposition with tin oxide segments 22.

The tin oxide is reduced to metallic tin in an electrolytic process wherein the tin oxide coating is made the cathode in an electrolytic cell containing an aluminum anode and a buffered acetic acid electrolyte. Application of an external voltage to the cell causes the desired reduction.

In order for the desired reduction to take place uniformly, the exposed surface of the tin oxide should be free of any undesired organic material. This is accomplished by immersing the substrate with its unbaked photoresist pattern in hot chromic acid for approximately 30 seconds. This removes any undesired material without disturbing the photoresist pattern itself. This step can be omitted if the unprotected tin oxide surface is known to be clean. Electrical contact is then made to the tin oxide layer along two opposite edges so that, when immersed in the electrolyte, a complete electrolytic cell will be formed. Electrical contact is made at the two opposite edges of the plate so that reduction proceeds, upon application of suitable voltage, inwardly from the conductors to minimize the time required for complete reduction. For example, application of 3 volts across the cell has been sufficient to reduce the unprotected tin oxide without (1) excessive heating which would cause the photoresist pattern to lift or (2) excessive exposure to the electrolyte which would cause the reduced tin to peel away from the supporting substrate.

An exemplary electrolyte is a buffered solution containing 5.6 grams per liter of acetic acid and 1.9 grams per liter of sodium acetate. This solution will maintain a pH of approximately 5.3. Greater acidity tends to attack the reduced tin quite rapidly. On the other hand, to obtain sufficient current density at low voltages, a relatively high hydrogen ion concentration is necessary. Other additives can be added to the electrolyte solution as desired, for example, 10 grams per liter of Eastman Kodak "Photo Flo 200" can be added to reduce the tendency of bubbles to collect on the substrate surface. The electrolyte is stirred continually during reduction so as to maintain uniform concentration throughout the solution.

The tin segments are opaque and form an excellent complementary mask which is inherently in perfect registration with juxtaposed segments of transparent tin oxide. As the photoresist segments overlying the tin oxide segments are also tranparent, exposure can be made through the substrate, the tin oxide and the photoresist to photochemically modify subsequently deposited material.

Figure 4:
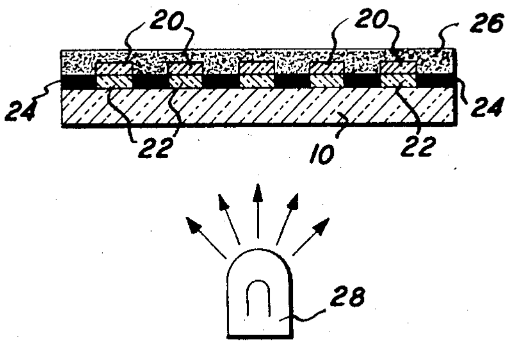

After reduction of the unprotected portions of tin oxide to opaque, metallic tin, the exposed surfaces of the metallic tin and the photoresist material are coated with a thin layer of photoresist material having an electroluminescent phosphor material dispersed throughout. This can best be seen in FIG. 4 wherein photoresist-electroluminescent phosphor layer 26 is shown positioned over segments 20 of photoresist and segments 24 of metallic tin. FIG. 4 also illustrates exposure of the photoresist-electroluminescent phosphor layer 26 to insolubilizing radiation from light source 28. Since layer 26 is exposed through support 10, segments 20 of photoresist and segments 22 of transparent tin oxide, only those portions of the photoresist-electroluminescent phosphor layer above these areas will be insolubilized. The opaque tin segments 24 function as a complementary mask, inherently in precise, accurate registration, to prevent insolubilization of those portions of layer 26 above segments 24. Within limits, the thickness of the phosphor layer may be varied by varying the exposure time.

The photoresist-electroluminescent phosphor layer may contain, for example, 1.5 parts by weight phosphor to about 1 part by weight photoresist and can be deposited onto the surface of the panel to some nominal thickness, for example, several mils, greater than the desired final thickness. The plate is then baked at appropriate conditions for sufficient time to dry and cure this light-sensitive layer. After exposure, the plate is developed by fist immersing it in a photoresist developer to soften the unexposed portions over the opaque tin followed by removing the softened portions, for example, by spraying with developer and then spraying with a detergent solution. The plate is finally rinsed in deionized water and dried. Optionally, these development steps can be repeated several times to improve the sharpness of the edges produced.

After development is completed, the plate is rinsed thoroughly in deionized water, immersed in a 5% solution of hydrochloric acid and dried to remove all traces of the reduced tin segments not protected by the photoresist pattern.

Figure 5:
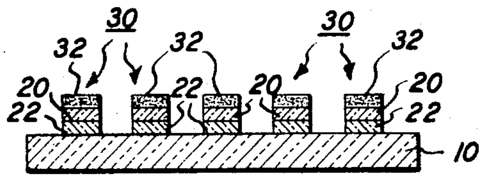

After removal of the unexposed portions of photoresist-phosphor layer 26 and segments 24 of metallic tin, the supporting substrate 10 has overlying layers 30 of photoresist segments 20 sandwiched between transparent tin oxide segments 22 and photoresist-electroluminescent phosphor segments 32, as can best be seen in FIG. 5. Normally, the overlying layers will be in the form of substantially parallel strips extending the width of the supporting substrate; however, other configurations can be produced provided appropriate electrical connections can be made so that the device can be subsequently utilized for display purposes.

Figure 6:
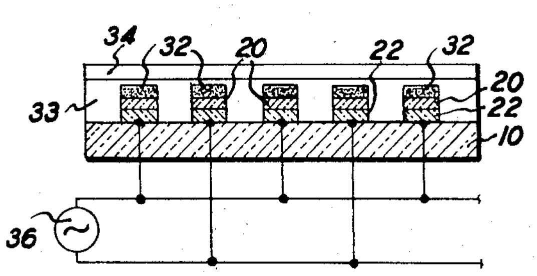

The completed solid state storage panel is shown in FIG. 6 wherein a layer 33 of insulating material has been deposited over and inbetween vertical layers 30 of deposited material. The insulating material, for example an epoxy resin deposited by spraying, functions to seal the phosphor segments from ambient moisture, and to insulate the edges of the tin oxide thus reducing the tendency of electrical breakdown at protected points. On top of layer 33 there is deposited a field effect semiconductor control layer 34. Finally, electrical connections are made to tin oxide segments 22 to enable the application of a voltage therebetween. Alternating electrodes are connected to one side of an alternating current potential source 36 with the intermediate electrodes being connected to the other side of the same source.

The advantages of the aforementioned process are many. Specifically, only one photographic mask is required to produce the stated structure wherein a plurality of overlying layers are fabricated upon a supporting substrate. The reduction of the unprotected transparent tin oxide to opaque metallic tin and the functioning thereof as a complementary mask during subsequent exposure inherently assures perfect registration of juxtaposed and overlying layers. Additionally, this technique has several advantages over the conventional zinc dust/hydrochloric acid method. There is no undercutting of the masking material; therefore, the edges are extremely sharp allowing achievement of very high resolution. Moreover, there is very little heat generated, making a postbaking treatment of the photoresist masking unnecessary to prevent lifting.

The storage panel is used in combination with means for depositing a charge pattern on the charge-retaining surface. At least one portion of the electroluminescent material forms part of the electrical connection between adjacent electrodes with the successive part of the electrical connection being formed by a portion of the field effect semiconductor material. That is, current flows from one electrode through a portion of the electroluminescent material, a portion of the field effect semiconductor material and then through a different portion of the electroluminescent material to an adjacent electrode. By formation and/or modification of an electrostatic charge pattern on the charge-retaining surface, a corresponding output image can be produced and stored on the electroluminescent device.

As used in this application, the term "field effect semiconductor" refers to a material capable of conducting current through the body thereof but which has the conductance thereof modified by applying an electric field perpendicular to the current flow thereby creating a region which effectively changes the conducting cross-section of the semiconducting material or changes the conductivity of the material itself. In the preferred embodiment, the field effect semiconductor material should be capable of retaining for substantial periods of time an electrostatic charge pattern on its surface and conducting current through the body thereof without substantially altering the surface charge pattern. When a single material has both of these physical properties it will be referred to as a "storing field effect semiconductor." That is, the "storing field effect semiconductor" is capable of retaining an electrostatic charge pattern on its surface which then produces the perpendicular electric field for modifying the conductance of the semiconductor material. Suitable materials exhibiting this combination of characteristics include zinc oxide, lead oxide, and cadmium oxide.

Where the field effect semiconductor material is a "storing field effect semiconductor" as herein defined, the charge-retaining surface of the storage panel is the exposed surface of the field effect semiconductor. However, where the field effect semiconductor material is incapable of retaining an electrostatic charge pattern on its exposed surface for the desired period of time, a thin electrically insulating layer is disposed thereover and the exposed surface thereof functions as the charge-retaining surface. Thus, many semiconductors which exhibit the field effect phenomena can be adapted to the practice of this invention even though they are, initially, incapable of retaining an electrostatic charge pattern on their surface for the desired period of time. Typical semiconductors exhibiting the field effect phenomena which can be so modified include cadmium sulfide, zinc sulfide, cadmium selenide, etc. Additionally, zinc oxide and the other storing field effect semiconductors can have an insulating layer deposited thereon if desired. Alternatively, a barrier layer can be produced along the outer surface of the semiconductor material by suitably doping the semiconductor to provide a p-n junction. The junction will act as a blocking layer preventing the passage of surface charge into the underlying material.

For brevity, all forms of the field effect semiconducting material will be referred to herein as the semiconducting material or the field effect semiconducting material, it being understood that the storage panel has an exterior non-supporting substrate surface which is capable of retaining an electrostatic charge pattern thereon for substantial periods of time.

It is thus apparent that the term "field effect semiconductor" has been defined to include single layer materials as well as a two-layered structure wherein the semiconductor material is modified as stated above. While these materials have been drawn together for purposes of definition, they are not true equivalents for, in many circumstances as will hereinafter be described, they have different modes of operation. More importantly, though the results attained with these different structures may be equivalent from an operational point of view, it should be appreciated that the capability of achieving a desired result with a single material renders that material superior to a second material which must be modified, in a stated manner, to achieve the same result.

In the preferred technique of operation an alternating current voltage is applied between the spaced electrodes which is sufficient to induce electroluminescence when the semiconductor material is in low impedance state. It has been found that the deposition and retention of an electrostatic charge on the charge-retaining surface of the electroluminescent panel can be used to control the flow of current from electrode to electrode. Deposition of the electrostatic charge increases the impedance of the semiconductor thereby reducing or interrupting the flow of current in adjacent areas. Reduction of current flow will cause a corresponding reduction in light output from the electroluminescent layer resulting in a half-toned response. If the current is lowered below that which is sufficient to induce electroluminescence, luminescence will not occur and that particular portion of the storage device will appear dark. Conversely, the impedance is lowered and current flow increased as the charges are neutralized or removed from the surface. Accordingly, by selectively placing and maintaining a charge pattern on the surface of the electroluminescent panel an image can be produced and stored upon the device.

In an alternate technique of operation, an alternating current voltage is applied between the spaced electrodes which is slightly insufficient to induce electroluminescence when the semiconductor material is in its normal impedance state. By forming an electrostatic charge of proper polarity on the charge-retaining surface of the electroluminescent panel the impedance of the semiconductor material can be lowered so that current will flow between spaced electrodes through the electroluminescent layer thereby resulting in light output. Conversely, the impedance is increased and current flow decreased as these charges of proper polarity are neutralized or removed from the charge-retaining surface. Once the impedance increases to a point where the current is lowered below that which is sufficient to induce electroluminescence, luminescence will not occur and that particular portion of the storage device will appear dark. Thus, images can be produced and stored upon this device by selectively placing and maintaining a charge pattern on the charge-retaining surface.

The polarity of surface charge which will reduce conductivity through the field effect semiconductor layer is the same as the polarity of charges which are preferentially conducted through that layer. That is, an n-type semiconductor will have the conductivity therethrough diminished by the deposition of negative charges on the charge-retaining surface. Conversely, a p-type semiconductor will have the conductivity therethrough diminished by the deposition of positive charges on the charge-retaining surface. On the other hand, conductivity may be increased by depositing charges of opposite polarity to the polarity of charges which are preferentially conducted through the semiconductor layer. By manipulating the operating conditions properly, and by depositing charge of opposite polarity to that preferentially carried by the semiconductor layer, the storage panel in adjacent areas can be made to either glow more brightly or to emit light from previously darkened portions.

When it is desired to produce a white picture on a black background, an electrostatic charge is uniformly deposited over the entire charge retention surface. Neutralizing or removing a portion of the charge will cause current flow in adjacent areas thereby resulting in luminescence of the phosphor layer beneath the areas where charge has been neutralized or removed. A white picture on a black background can also be obtained by depositing a selected electrostatic charge pattern wherein dark background areas correspond to areas of charge deposition. Luminescence of the phosphor layer beneath those areas of the semiconductor layer where no charge resides will produce a white picture on a black background.

When it is desired to have a black picture on a white background, a selected electrostatic charge pattern is placed on the charge retention surface. This results in an increase in the impedance of the semiconductor thereby interrupting the flow of current in adjacent areas. When current flow falls below the level which is sufficient to induce electroluminescence, that portion of the storage device where the charge resides will appear dark, and a black on white picture will be obtained. Alternatively, a uniform electrostatic charge can be applied to the charge retaining surface and then a portion of the charge corresponding to the white background areas can be removed or neutralized to produce the desired result of a black picture on a white background.

The above optical output can also be achieved by applying an alternating current voltage between the spaced electrodes which is insufficient to induce electroluminescence when the semiconductor material is in its normal impedance state. Deposition of charge of proper polarity will cause a decrease in impedance with a corresponding light output in adjacent areas. Whether a black picture on a white background or vice versa results will depend upon the charge deposition and/or removal steps in a manner analogous to that described in the preceding two paragraphs.

The electrostatic charge pattern can be produced on the surface of the electroluminescent device by any suitable means. For example, it is contemplated that optical or electrical means can be utilized to deposit the desired charge pattern.

One manner of producing a charge pattern is by uniformly depositing charged ions on the charge-retaining surface and then dissipating a portion of said ions to form either a positive or a negative of the image to be reproduced. For example, if the field effect semiconductor also has photoconductive insulating properties, such as is the case with zinc oxide, the uniform electrostatic charge can be deposited by any well known means, including corona discharge. Selective dissipation of a portion of a surface charge can be achieved by exposing only selected portions of the field effect semiconductor material to actinic radiation. The latent electrostatic image which results acts to control current flow between adjacent electrodes.

In contrast to where the storage panel is exposed to a full frame light image, one or more point sources of light can be made to scan the charge-retaining surface. Modulation of the intensity of the input light will result in a corresponding half-tone output image.

Alternatively, means can be provided for initially depositing charged ions in the desired charge pattern. For example, electrostatic charges can be deposited by using the apparatus disclosed by Schwertz in U.S. Pat. No. 3,023,731. Specifically, the recording heads of FIGS. 5 and 7, or the character drum of FIG. 3 of that reference, can be used in the manner as disclosed therein to deposit a selective ionic charge pattern upon the charge-retaining surface of the present storage device. A charge pattern can also be deposited on the charge-retaining surface, for example, by corona charging through a pattern-defining mask. Or, as shown in the aforementioned copending application, the corona charging device of FIG. 8 can be sequentially scanned along vertical and horizontal conductors to cause corona emission at selected junctions and thereby selectively charge portions of an underlying storage panel. A further device for depositing the electrostatic charge pattern comprises one or more corona point sources which can be caused to scan the charge-retaining surface. The simultaneous application of electrical input signals to the corona points with the resultant deposition of electrostatic charge will either produce or modify an image on the electroluminescent storage device. In this embodiment, either the corona point system can be caused to scan back and forth or, in the alternative, the storage device itself can be made to oscillate under one or more corona point sources.

As is apparent, the output from the storage device can be modified by modifying the existing charge pattern stored on the charge-retaining surface. Such modifications include complete neutralization, partial neutralization or addition of new surface charge to the existing charge pattern.

The particular physical characteristics of zinc oxide, lead oxide, and cadmium oxide enable one to store a negative ionic charge pattern on its surface and control current flow through the body thereof by means of said charge pattern without substantially altering the charge pattern. Negative oxygen atoms, such as obtained by corona discharge or the electrostatic discharge disclosed by Schwertz in the aforementioned patent, are particularly suitable for controlling current flow. It has been found, however, that deposition of electron of positive ionic charge patterns may not have controlling effect because the field effect semiconductor will not retain such a charge on its surface. Accordingly, it may be necessary to provide an insulating layer over the field effect semiconductor material when one wishes to control current flow by means of electron of positive ionic charge patterns.

The panel of the present invention is used in a manner similar to the panels disclosed in copending application Ser. No. 582,856 filed Sept. 29, 1966 (which is a continuation-in-part application of Ser. No. 514,860 filed Dec. 20, 1965) and copending application Ser. No. 722,-285 filed Apr. 18, 1968. For example, the herein disclosed panel can be utilized as a target for an evacuated storage tube such as shown in FIG. 9 of Ser. No. 582,856, using an inert supporting substrate, such as glass, and an inorganic material for the binder of the conductive powder material is utilized. Accordingly, to complete the disclosure of this application, the aforementioned applications are included herein by reference.

Since the supporting substrate, tin oxide electrodes and overlying photoresist signals are transparent, a stored image can be viewed from the substrate side of the panel. If, however, it is desired to view the storage panel from the field effect semiconductor side, then the semiconductor layer and any overlying and/or underlying insulating layers should be transparent to the light emitted by the electroluminescent phosphor segments.

While the invention has been described with reference to its preferred embodiments, it will be understood by those skilled in the art that various changes may be made and equivalents may be substituted without departing from the true spirit and scope of the invention. For example, other electrolytes can be utilized for the conversion of portions of the transparent, conductive layer to an opaque state, such as a 5% by weight solution of stannic chloride in water, so that upon application of low voltages, on the order of about 3 volts, the desired conversion can be obtained. Or, other transparent, conductive layers can be utilized in the place of the tin oxide herein described, such as copper iodide which is both transparent and conductive and can be reduced to opaque copper. Othes transparent conductive materials include indium oxide, silver iodide, copper sulfide, antimony chloride, etc. Other materials may also be substituted for materials herein disclosed, such as electrolytes, etc. as will be apparent to those skilled in this art. Additionally, many modifications can be made to adapt a particular operation or material to the spirit of the invention without departing from its essential teachings.

What is claimed is:

1. A method for fabricating a solid state storage panel comprising providing a transparent supporting substrate having a thin, transparent, conductive metallic compound layer thereon, said metallic compound capable of being reduced to an opaque metallic state; coating the metallic compound layer surface with a thin layer of transparent photoresist material; exposing the photoresist material through a photographic mask to actinic radiation to insolubilize exposed portions thereof; removing the unexposed portions of said photoresist material; reducing those portions of said transparent metallic compound layer unprotected by the remaining portions of said photoresist material to the opaque metal to provide juxtaposed segments of transparent metallic compound and opaque metal; coating the exposed metal and photoresist surfaces with a photoresist-electroluminescent phosphor material; exposing said photoresist-electroluminescent phosphor material through said transparent supporting substrate, said transparent metallic compound segments and the transparent photoresist material overlying said transparent metallic compound segments to actinic radiation to insolubilize exposed portions of said photoresist-electroluminescent phosphor material; removing the unexposed portions of said photoresist-electroluminescent phosphor material; removing said segments of opaque metal; depositing an electrically insulating material between the vertical stacks of photoresist material sandwiched between an underlying segment of transparent metallic compound and an overlying segment of photoresist-electroluminescent phophor material; and depositing a field effect semiconductor control layer uniformly over the working surface of said panel.

2. The method of claim 1 wherein said metallic compound is a metallic oxide.

3. The method of claim 1 wherein said insulating material is also applied to the top exposed surface of said segments of photoresist-electroluminescent phosphor material so that said control layer is uniformly deposited thereon.

4. The method of claim 2 wherein said metallic oxide is electrolytically reduced to the metallic state.

5. The method of claim 2 wherein said metallic oxide is reduced by forming an electrolytic cell having an anode, the photoresist patterned metallic oxide coated supporting substrate as the cathode and electrolyte capable, upon application of appropriate voltage to said anode and to said cathode, of reducing unprotected metallic oxide to the metallic state.

6. The method of claim 5 wherein said electrolyte comprises a buffered solution containing acetic acid and sodium acetate.

7. The method of claim 6 wherein said electrolyte has a pH of about 5.3.

8. The method of claim 5 wherein said electrolyte comprises a solution of stannic chloride in water.

9. The method of claim 5 wherein said electrolyte has a pH of approximately 5.0–6.0.

10. The method of claim 2 wherein said metallic oxide is tin oxide.

References Cited

UNITED STATES PATENTS

| | | | |
|---|---|---|---|
| 3,095,317 | 6/1963 | Soffire | 96—36.1UX |
| 3,226,611 | 12/1965 | Haenichen | 96—36.2UX |
| 3,248,218 | 4/1966 | Messineo | 96—36.1 |
| 3,441,736 | 4/1969 | Kazan et al. | 250—213 |
| 3,481,777 | 12/1969 | Spannhake | 96—36.2X |

DAVID KLEIN, Primary Examiner

U.S. Cl. X.R.

29—578, 569; 96—38.4, 44, 45.1; 250—213; 315—169